(12) United States Patent
Smitchger et al.

(10) Patent No.: US 12,040,025 B2
(45) Date of Patent: Jul. 16, 2024

(54) TWO-SIDED PAGE SCANS WITH CALIBRATION FEEDBACK

(71) Applicant: Micron Technology, Inc., Boise, ID (US)

(72) Inventors: Christopher M. Smitchger, Boise, ID (US); Vamsi Pavan Rayaprolu, San Jose, CA (US); Patrick R. Khayat, San Diego, CA (US); Hyung Seok Kim, Santa Clara, CA (US); Steven Michael Kientz, Westminster, CO (US)

(73) Assignee: Micron Technology, Inc., Boise, ID (US)

( * ) Notice: Subject to any disclaimer, the term of this patent is extended or adjusted under 35 U.S.C. 154(b) by 293 days.

(21) Appl. No.: 17/675,392

(22) Filed: Feb. 18, 2022

(65) Prior Publication Data

US 2023/0268009 A1 Aug. 24, 2023

(51) Int. Cl.
| | | |
|---|---|---|
| *G11C 11/34* | (2006.01) | |
| *G06F 11/07* | (2006.01) | |
| *G11C 16/14* | (2006.01) | |
| *G11C 16/26* | (2006.01) | |
| *G11C 16/04* | (2006.01) | |

(52) U.S. Cl.
CPC ............ *G11C 16/26* (2013.01); *G06F 11/073* (2013.01); *G06F 11/0787* (2013.01); *G11C 16/14* (2013.01); *G11C 16/0483* (2013.01)

(58) Field of Classification Search
CPC ....... G11C 16/26; G11C 16/14; G06F 11/073; G06F 11/0787
USPC ...................................... 365/185.29
See application file for complete search history.

(56) References Cited

U.S. PATENT DOCUMENTS

| | | | |
|---|---|---|---|
| 2013/0219107 A1* | 8/2013 | Lee ............ | G11C 11/5628 711/E12.008 |
| 2018/0366209 A1* | 12/2018 | Mehta .......... | G06F 3/0653 |
| 2022/0044737 A1* | 2/2022 | Khayat ......... | G11C 11/5642 |

* cited by examiner

*Primary Examiner* — Vu A Le
(74) *Attorney, Agent, or Firm* — Lowenstein Sandler LLP (57) ABSTRACT

A system includes a memory device including an block and a processing device, operatively coupled with the memory device, to perform operations including initiating a page scan with respect to a page of the block, determining whether to perform an erased page check, and in response to determining that the erased page check is not to be performed, performing a two-sided page scan with calibration feedback.

20 Claims, 5 Drawing Sheets

TWO-SIDED PAGE SCANS WITH CALIBRATION FEEDBACK

TECHNICAL FIELD

Embodiments of the disclosure relate generally to memory sub-systems, and more specifically, relate to two-sided page scans with calibration feedback.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed two-sided page scans with calibration feedback. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can include multiple bits arranged in a two-dimensional grid. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

A memory cell can be programmed (written to) by applying a certain voltage to the memory cell, which results in an electric charge being held by the memory cell. For example, a voltage signal $V_{CG}$ that can be applied to a control electrode of the cell to open the cell to the flow of electric current across the cell, between a source electrode and a drain electrode. More specifically, for each individual memory cell (having a charge Q stored thereon) there can be a threshold control gate voltage $V_T$ (herein also referred to as the "threshold voltage" or simply as "threshold") such that the source-drain electric current is low for the control gate voltage ($V_{CG}$) being below the threshold voltage, $V_{CG} < V_T$. The current increases substantially once the control gate voltage has exceeded the threshold voltage, $V_{CG} > V_T$. Because the actual geometry of the electrodes and gates varies from cell to cell, the threshold voltages can be different even for cells implemented on the same die. The memory cells can, therefore, be characterized by a distribution P of the threshold voltages, $P(Q, V_T) = dW/dV_T$, where dW represents the probability that any given cell has its threshold voltage within the interval $[V_T, V_T + dV_T]$ when charge Q is placed on the cell.

A memory device can have distributions $P(Q, V_T)$ that are narrow compared with the working range of control voltages tolerated by the cells of the device. Accordingly, multiple non-overlapping distributions $P(Q_k, V_T)$ ("valleys") can be fit into the working range allowing for storage and reliable detection of multiple values of the charge $Q_k$, k=1, 2, 3 . . . . The distributions (valleys) are interspersed with voltage intervals ("valley margins") where none (or very few) of the memory cells of the device have their threshold voltages. Such valley margins can, therefore, be used to separate various charge states $Q_k$—the logical state of the cell can be determined by detecting, during a read operation, between which two valley margins the respective threshold voltage $V_T$ of the cell resides. This effectively allows a single memory cell to store multiple bits of information: a memory cell operated with 2N−1 well-defined valley margins and 2N valleys is capable of reliably storing N bits of information. Specifically, the read operation can be performed by comparing the measured threshold voltage $V_T$ exhibited by the memory cell to one or more reference voltage levels corresponding to known valley margins (e.g., centers of the margins) of the memory device.

One type of memory cell ("cell") is a single level cell (SLC), which stores 1 bit per cell and defines 2 logical states ("states") ("1" or "L0" and "0" or "L1") each corresponding to a respective $V_T$ level. For example, the "1" state can be an erased state and the "0" state can be a programmed state (L1). Another type of cell is a multi-level cell (MLC), which stores 2 bits per cell and defines 4 states ("11" or "L0", "10" or "L1", "01" or "L2" and "00" or "L3") each corresponding to a respective $V_T$ level. For example, the "11" state can be an erased state and the "01", "10" and "00" states can each be a respective programmed state. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_T$ level. For example, the "111" state can be an erased state and each of the other states can be a respective programmed state. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. Thus, an n-level cell can use $2^n$ levels of charge to store n bits. A memory device can include one or more arrays of memory cells such as SLCs, MLCs, TLCs, QLCs, PLCs, etc. or any combination of such. For example, a memory device can include an SLC portion, and an MLC portion, a TLC portion, a QLC portion, or a PLC portion of memory cells.

A valley margin can also be referred to as a read window. For example, in a SLC cell, there is 1 read window that exists with respect to the 2 $V_T$ distributions. As another example, in an MLC cell, there are 3 read windows that exist with respect to the 4 $V_T$ distributions. As yet another example, in a TLC cell, there are 7 read windows that exist with respect to the 8 $V_T$ distributions. Read window size generally decreases as the number of states increases. For example, the 1 read window for the SLC cell may be larger than each of the 3 read windows for the MLC cell, and each of the 3 read windows for the MLC cell may be larger than each of the 7 read windows for the TLC cell, etc. Read window budget (RWB) refers to the cumulative value of the read windows.

One phenomenon observed in memory devices is $V_T$ distribution shift, also referred to herein as temporal voltage shift (TVS). For example, with respect to programmed pages of a block, storage charge loss (SCL) can cause $V_T$ distributions of the programmed pages to shift towards lower voltages as charge diminishes over, e.g., time and/or temperature. That is, SCL and the corresponding $V_T$ distribution shift towards lower voltages can be proportional to the elapsed time from a programming operation to a read operation. Conversely, with respect to erased pages (e.g., erased pages of partially programmed blocks), storage charge gain (SCG) can cause $V_T$ distributions of the erased pages to shift towards higher voltage.

Higher cycling requirements (e.g., SLC cycling requirements) have introduced a need for more accurate scanning of blocks to detect data degradation. For example, typical media scan procedures may be too slow to react depending on the relationship of the read level to the $V_T$ distribution shift. Some media scan procedures utilize a single read level. Illustratively, in an SLC implementation, a single valley defining a read window exists between the erased state ("1") distribution and the programmed state ("0") distribution. Due to the read window between the erased state distribution and the programmed state distribution being relatively large for SLC cells, these distributions may have to undergo a large shift to capture data retention loss. Thus, if a single read level is placed too close to a left edge of the valley (e.g., closer to the erased state distribution), the media scan may have been performed too late to capture data retention loss. Similarly, if the read level is placed too close to the right edge of the valley (e.g., closer to the programmed state distribution), the media scan may have been performed too late to capture charge gain. Accordingly, due to the relatively large read window between SLC cell erased state and programmed state distributions, it may be ineffective to detect data retention loss by employing SLC media scans utilizing a single read level.

Aspects of the present disclosure address the above and other deficiencies by providing a memory sub-system that implements two-sided page scans with calibration feedback. In some embodiments, a two-sided page scan is a two-sided SLC page scan. A two-sided page scan is used to read a page of a block when the page is determined to be programmed (e.g., non-empty). The two-sided read approach provides feedback (e.g., valley health metric(s)) that can be used to determine whether to refresh or recalibrate the block. The block can include one or more programmed pages and/or one or more erased pages. In some embodiments, the block is an open block (e.g., a block that is currently open for programming). In some embodiments, the block is a closed block (e.g., a fully programmed block).

For example, after obtaining a calibrated read level from a default read level, a controller can obtain an error metric by reading the page using a first multi-strobe read. The first multi-strobe read is performed to detect shifts in edges of a valley between adjacent $V_T$ distributions (e.g., edges of a valley between an erased state distribution and a programmed state distribution of an SLC cell) in a single operation. After obtaining the error metric, the controller can determine whether the error metric satisfies a first threshold condition (e.g., whether the BEC/BER/BERatio is greater than a threshold BEC/BER/BERatio). If not, then the page scan is exited with the block being maintained (e.g., not refreshed). If so, the controller can proceed to obtain a set of parameters by reading the page using a second multi-strobe read. For example, the second multi-strobe read can be a three-strobe read to obtain a set of parameters including three parameters. The controller can then determine whether to maintain the block, refresh the block, or trigger calibration by analyzing the set of parameters. Further details regarding the operations performed by the controller will be described below with reference to FIGS. 1-5B.

The method performed by the memory sub-system described above can be implemented with any suitable memory device architecture in accordance with the embodiments described herein. In one embodiment, the method can be implemented with a memory device implementing replacement gate NAND (RG NAND) technology. A replacement gate (RG) NAND device is a NAND device that implements a RG architecture rather than a floating gate (FG) architecture. The RG NAND architecture removes cell gaps that are typically found in FG NAND architectures, thereby reducing or eliminating capacitance resulting from those cell gaps. More specifically, the RG NAND architecture corresponds to a single-insulator structure. The RG NAND architecture can enable smaller size, improved read and write latency, and increase in transfer rate as compared to the FG NAND architecture.

Advantages of the present disclosure include, but are not limited to, improved memory device performance. For example, implementations described herein can improve capture of data retention loss, and therefore decrease error rates.

Figure 1:
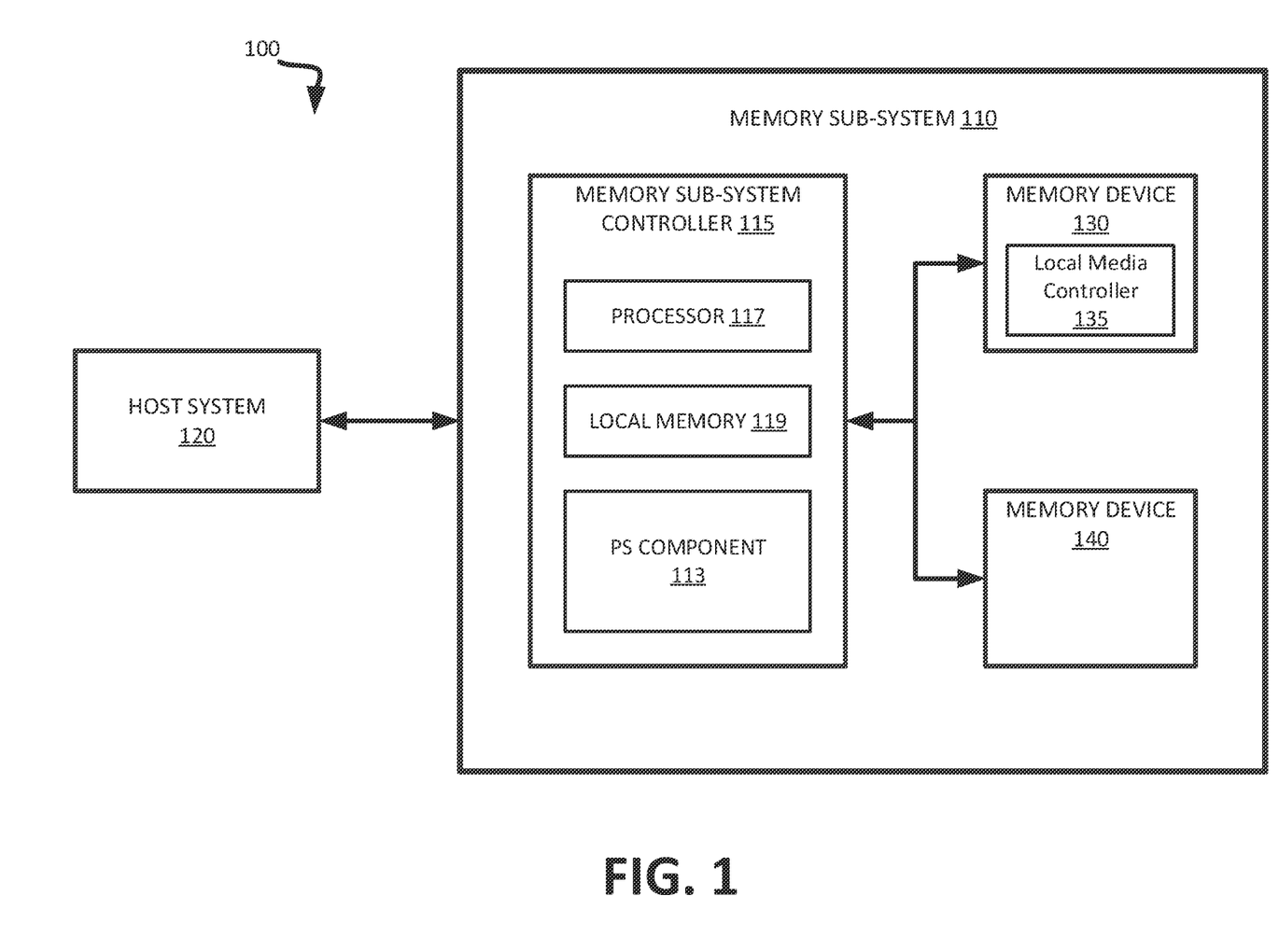
FIG. 1 illustrates an example computing system that includes a memory sub-system, in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The memory sub-system 110 includes a page scan (PS) component 113 that can implement two-sided page scans with calibration feedback. In some embodiments, a two-sided page scan is a two-sided SLC page scan. A two-sided page scan is used to read a page of a block when the page is determined to be programmed (e.g., non-empty). The two-sided read approach provides feedback (e.g., valley health metric(s)) that can be used to determine whether to refresh or recalibrate the block. The block can include one or more programmed pages and/or one or more erased pages. In some embodiments, the block is an open block (e.g., a block that is currently open for programming). In some embodiments, the block is a closed block (e.g., a fully programmed block).

For example, after obtaining a calibrated read level from a default read level, the PS component 113 can obtain an error metric by reading the page using a first multi-strobe read. The error metric can be at a bit error count (BEC), which is a count of the number of "0" bits. Additionally or alternatively, the error metric can be a bit error rate (BER), which is a number of bit errors per unit time. Additionally or alternatively, the error metric can be a bit error ratio (BERatio), which is defined by a number of bit errors divided by the total number of transferred bits during a time interval (e.g., a percentage). The first multi-strobe read is performed to detect shifts in edges of a valley between adjacent $V_T$ distributions (e.g., edges of a valley between an erased state distribution and a programmed state distribution of an SLC cell) in a single operation.

In some embodiments, the first multi-strobe read is a two-strobe read. During a two-strobe read, a negative read level offset and a positive read level offset can be defined with respect to the calibrated read level. The PS component 113 can cause a strobe read to be performed using the negative read level offset to detect the shift of the left edge of the valley. The PS component 113 can further cause a strobe read to be performed using the positive read level offset to detect the shift of the right edge of the valley. For a two-strobe read, a single value can be output for each cell that measures the number of bits that exist between the negative read level offset and the positive read level offset. For example, the output of a two-strobe read can include BEC. Additionally or alternatively, the output of a two-strobe read can be translated into BER, BERatio, etc. Accordingly, the outputs from the two-strobe read can then be used to identify the current center of the valley.

For example, the two-strobe read can be a single bit soft bit read (SBSBR). The bit information obtained by comparing the $V_T$ values of cells to integral reference voltages may be referred to as "hard bits." Additional information obtained by comparing the $V_T$ values of the cells to fractional reference voltages can be referred to as "soft bits." For example, determining that the $V_T$ of a cell lies between a voltage $V_1$ and a voltage $V_2$ provides hard bit information, and determining that the $V_T$ of the cell lies between $V_1$ and $V_{1.5}$ or $V_{1.5}$ and $V_2$ provides soft bit information. Illustratively, a soft bit can be a logical "1" for low fractional reference voltages and can be a logical "0" for high fractional reference voltages. For example, determining that the $V_T$ of the cell is between $V_1$ and $V_{1.5}$ can result in obtaining a soft bit of "1", determining that the $V_T$ of the cell is between $V_{1.5}$ and $V_2$ can result in obtaining a soft bit of "0". Soft bits can improve error correction code (ECC) capability (e.g., the ECC capability of an ECC decoder). For example, soft bits can be used to determine hard bit reliability. As another example, soft bits can be used to determining which hard bits to correct when there may be ambiguity.

Data output from SBSBR can be the exclusive nor (XNOR) of the output of the positive read level offset strobe read and the output of the negative read level offset strobe read. XNOR inverts the output of an exclusive or (XOR) operation. Thus, XNOR can returns a logical "1" if inputs A and B are equal, and can return a logical "0" otherwise. For example, if A=0 and B=0 or A=1 and B=1, then A XNOR B=1. If A=0 and B=1 or B=0 and A=1, then A XNOR B=0. As an illustrative example, assume that the output of the positive read level offset strobe read is "111100" and the output of the negative read level offset strobe read is "110000". Then, the data output from SBSBR is "110011".

In some embodiments, the first multi-strobe read is a three-strobe read. During a three-strobe read, a left read level offset, a right read level offset and a center read level offset can be defined. For example, the center read level offset may be equidistant from the negative read level offset and the positive read level offset. However, the center read level offset could be located closer to one of the negative read level offset or the positive read level offset. The PS component 113 can further cause respective strobe reads to be performed using the negative read level offset, the positive read level offset, and the center read level offset. For example, for each cell, respective values can be output for the negative read level offset, the positive read level offset, and the center read level offset. These outputs can be used to calculate a metric to identify the current center of the valley. Accordingly, the outputs from the three-strobe read can then be used to identify the current center of the valley.

For example, the three-strobe read can implement read sample offset (RSO) reads. RSO reads can be used to compute an estimated center of a valley. For example, the RSO reads can implement a three-strobe read with the left, right and center read level offsets to obtain a left estimated center sample (LEC), a right estimated center sample (REC), and a center estimated center sample (CEC). An estimated center differential (DiffEC) can be calculated as the difference between the average of LEC and REC, and CEC $$\left(\frac{LEC + REC}{2} - CEC\right).$$

Accordingly, DiffEC can be viewed as a measure of valley width. Since additional information can be provided by three-strobe reads (e.g., RSO reads), three-strobe read implementations can provide improved results as compared to two-strobe read implementation, at the expense of greater latency and performance loss.

After obtaining the error metric, the PS component 113 can determine whether the error metric satisfies a first threshold condition (e.g., whether at least one of a BEC/BER/BERatio is greater than at least one of a respective threshold BEC/threshold BER/threshold BERatio). If not, then the page scan is exited with the block being maintained (e.g., not refreshed). If so, the controller can proceed to obtain a set of parameters by reading the page using a second multi-strobe read. For example, the second multi-strobe read can be three-strobe read. If the three-strobe read implement RSO reads, then the set of parameters can include LEC, REC and DiffEC.

The PS component 113 can determine whether to maintain the block, refresh the block, or trigger calibration based on the set of parameters. For example, assume that the set of parameters includes LEC, REC and DiffEC. The controller can determine whether DiffEC satisfies a second threshold condition (e.g., whether DiffEC is greater than a DiffEC threshold). If so, then the controller can exit the page scan and refresh the block. If not, then the PS component 113 can determine whether LEC or REC satisfies a third threshold condition (e.g., whether LEC or REC is greater than a calibration threshold). If so, then the PS component 113 can exit the page scan and trigger calibration (e.g., SLC calibration) to recalibrate the block. If not, then the PS component 113 can exit the page scan and maintain the block.

In some embodiments, the memory sub-system controller 115 includes at least a portion of the PS component 113. In some embodiments, the PS component 113 is part of the host system 110, an application, or an operating system. In other embodiments, local media controller 135 includes at least a portion of PS component 113 and is configured to perform the functionality described herein. Further details regarding the operation of the PS component 113 are described below with reference to FIGS. 2-5B.

Figure 2:
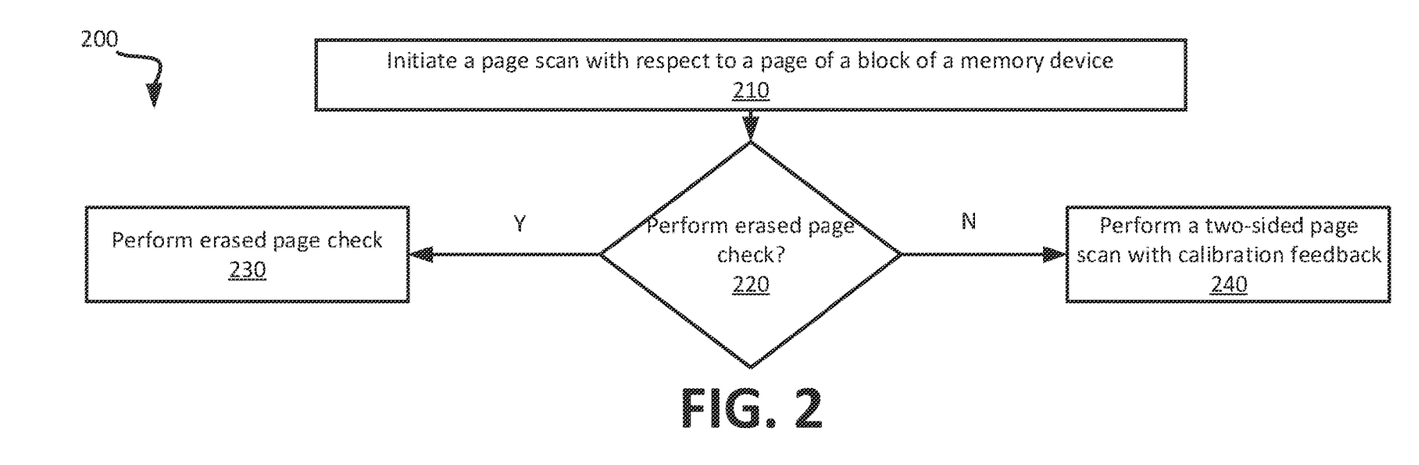
FIG. 2 is a flow diagram of a method for performing a page scan with respect to a page of a block of a memory device, in accordance with some embodiments of the present disclosure.

FIG. 2 is a flow diagram of an example method 200 for performing a page scan with respect to a page of a block of a memory device, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the PS component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing logic initiates a page scan with respect to a page of a block of a memory device. For example, the block can be a NAND block. In some embodiments, the page is connected to a number of SLC cells. The block can include one or more programmed pages and/or one or more erased pages. In some embodiments the block is an open block (e.g., a block that is currently open for programming). In some embodiments, the block is a closed block (e.g., a fully programmed block). Further details regarding the structure of a block will be described below with reference to FIG. 3.

At operation 220, the processing logic determines whether to perform an erased page check. For example, determining whether to perform an erased page check can include determining whether the block is a fully programmed block (e.g., a closed block). If the block is not a fully programmed block (e.g., an open block), then the processing logic can determine whether the page is empty. If the page is determined to be empty, the processing logic has determined that an erased page check should be performed, and can perform an erased page check at operation 230. The processing logic can then perform a two-sided page scan with calibration feedback at operation 240. If the processing logic has determined that an erased page check should not be performed (e.g., the block is a fully programmed block, or the block is not fully programmed and the page is determined to not be empty), then the processing logic can proceed to operation 240 to perform the two-sided page scan with calibration feedback (without performing the erased page check). Further details regarding operation 240 will be described below with reference to FIG. 4.

Figure 3:
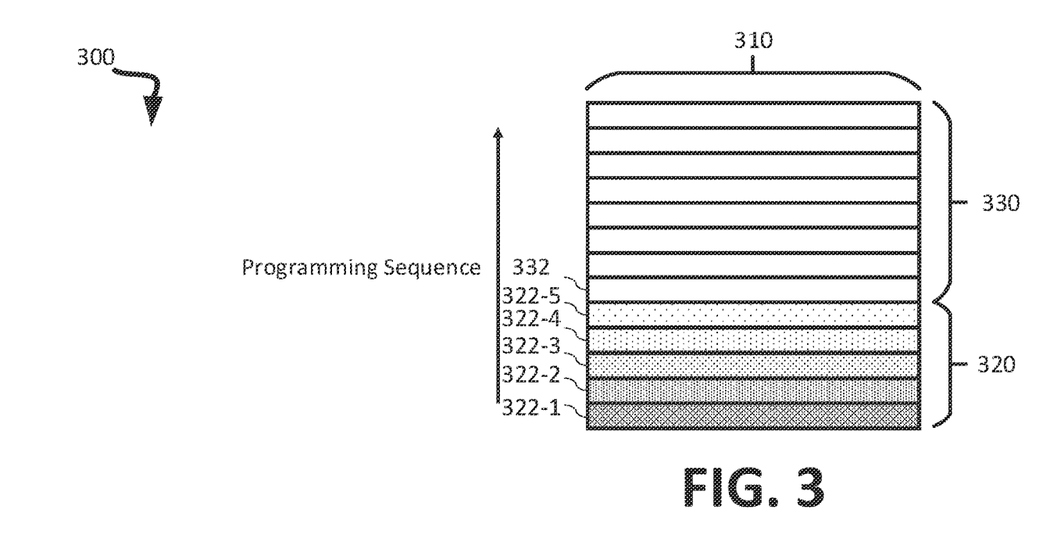
FIG. 3 is a diagram illustrating a block of a memory device, in accordance with some embodiments of the present disclosure.

FIG. 3 illustrates a diagram 300 illustrating an example block 310 of a memory device. For example, the block 310 can be a NAND block. In this illustrative example, the block 310 is an open block (e.g., a block that is currently open for programming). However, in other embodiments, the block 310 can be a closed block (e.g., a fully programmed block). As shown, the block 310 includes a set of programmed pages 320 and a set of erased pages 330. The set of programmed pages 320 includes programmed pages 322-1 through 322-5, where programmed page 322-1 corresponds to the oldest programmed page having the oldest programmed data, and programmed page 322-5 corresponds to the most recent programmed page having the newest programmed data. The set of erased pages 330 includes an erased page 332. The programming sequence goes upwards from the oldest programmed data (e.g., from page 322-1). As described in further detail above with reference to FIG. 2 and as will be described in further detail below with reference to FIG. 4, a two-sided page scan with calibration feedback can be performed with respect to the block 310.

Figure 4:
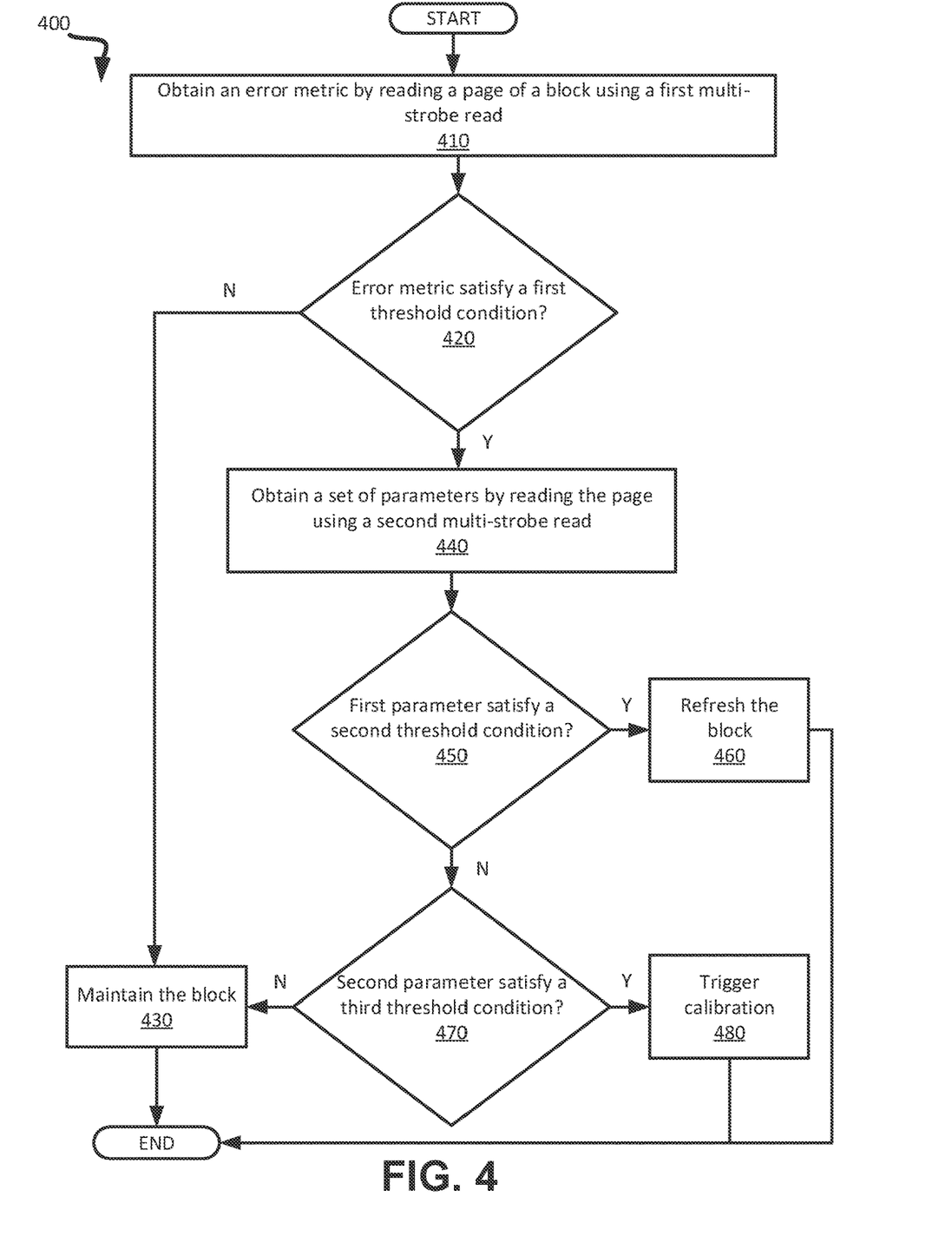
FIG. 4 is a flow diagram of a method for implementing two-sided page scans with calibration feedback, in accordance with some embodiments of the present disclosure.

FIG. 4 is a flow diagram of an example method 400 for implementing two-sided page scans with calibration feedback, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the PS component 113 of FIG. 1. For example, the method 400 can be performed as part of operation 240 of the method 200 described above with reference to FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic obtains an error metric by reading a page of a block using a first multi-strobe read. For example, the block can be a NAND block. In some embodiments, the page is connected to a number of SLC cells. The block can include one or more programmed pages and/or one or more erased pages. In some embodiments, the block is an open block (e.g., a block that is currently open for programming). In some embodiments, the block is a closed block (e.g., a fully programmed block).

The error metric can include at least one of: a bit error count (BEC), a bit error rate (BER), a bit error ratio (BERatio), etc. The first multi-strobe read is performed to detect shifts in edges of a valley between adjacent $V_T$ distributions (e.g., edges of a valley between an erased state distribution and a programmed state distribution of an SLC cell) in a single operation.

In some embodiments, the first multi-strobe read is a two-strobe read. During a two-strobe read, a negative read level offset and a positive read level offset can be defined with respect to the calibrated read level. The controller can cause a strobe read to be performed using the negative read level offset to detect the shift of the left edge of the valley. The controller can further cause a strobe read to be performed using the positive read level offset to detect the shift of the right edge of the valley. For example, the two-strobe read can be a single bit soft bit read (SBSBR).

In some embodiments, the first multi-strobe read is a three-strobe read. During a three-strobe read, a left read level offset, a right read level offset and a center read level offset can be defined. For example, the center read level offset may be equidistant from the negative read level offset and the positive read level offset. However, the center read level offset could be located closer to one of the negative read level offset or the positive read level offset. For example, the three-strobe read can implement read sample offset (RSO) reads.

At operation 420, the processing logic determines whether the error metric satisfies a first threshold condition. For example, determining whether the error metric satisfies the first threshold condition can include determining whether the BEC is greater than or equal to a threshold BEC. Additionally or alternatively, determining whether the error metric satisfies the first threshold condition can include determining whether the BER is greater than or equal to a threshold BER. Additionally or alternatively, determining whether the error metric satisfies the first threshold condition can include determining whether the BERatio is greater than or equal to a threshold BERatio.

If the error metric does not satisfy the first threshold condition, then the processing logic causes the block to be maintained at operation 430. For example, the processing logic can cause the page scan to exit with a block refresh value of false. The processing logic can then move onto the next page to initiate another page scan, as described above with reference to FIG. 2.

Otherwise, the processing logic performs further analysis to determine whether to refresh the block, trigger calibration of the block, or maintain the block. For example, at operation 440, the processing logic can obtain a set of parameters by reading the page using a second multi-strobe read. For example, the second multi-strobe read can be a three-strobe read, and the set of parameters can include LEC, REC and DiffEC.

At operation 450, the processing logic can determine whether a first parameter of the set of parameters satisfies a second threshold condition. For example, the first parameter can be DiffEC, and determining whether DiffEC satisfies the second threshold condition can include determining whether DiffEC is greater than or equal to a DiffEC threshold. If the first parameter satisfies the second threshold condition, then the processing logic causes the block to be refreshed at operation 460. For example, the processing logic can cause the page scan to exit with a block refresh value of true. The processing logic can then move onto the next page to initiate another page scan, as described above with reference to FIG. 2.

Otherwise, at operation 470, the processing logic can determine whether a second parameter of the set of parameters satisfies a third threshold condition. For example, the second parameter can be LEC or REC, and determining whether LEC or REC satisfies the third threshold condition can include determining whether LEC or REC is greater than or equal to a calibration threshold. If the second parameter satisfies the third threshold condition, this means that the read level should be recalibrated (e.g., to account for LEC or REC exceeding the calibration threshold). Thus, the processing logic at operation 480 triggers calibration of the block (e.g., trigger calibration of the die). Additionally, the processing logic causes the page scan to exit and move onto the next page to initiate another page scan, as described above with reference to FIG. 2. Otherwise, the processing logic causes the block to be maintained at operation 430.

Figure 5A:
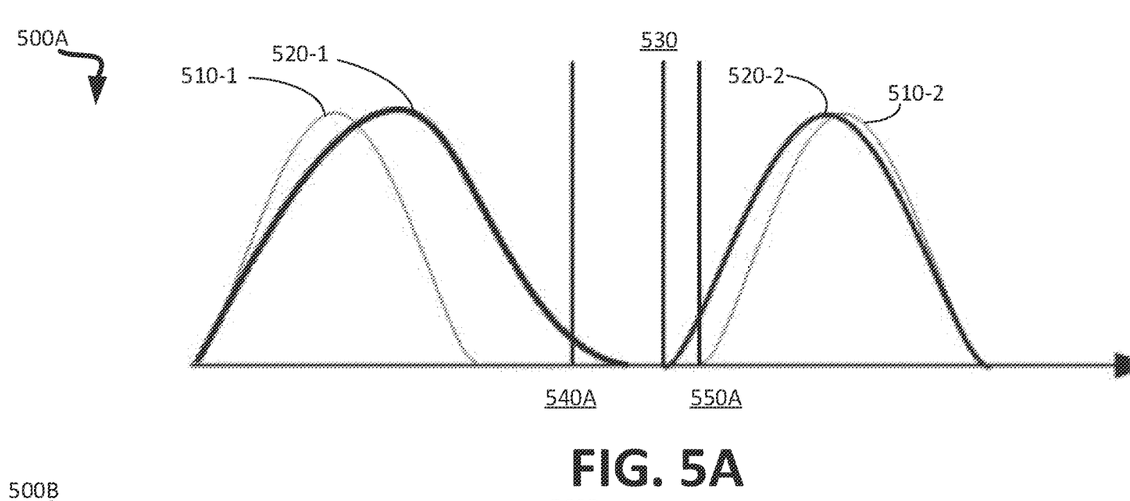
FIGS. 5A-5B are diagrams illustrating example implementations of multi-strobe reads that can be used to obtain an error metric during a two-sided page scan with calibration feedback, in accordance with some embodiments of the present disclosure.
Figure 5B:
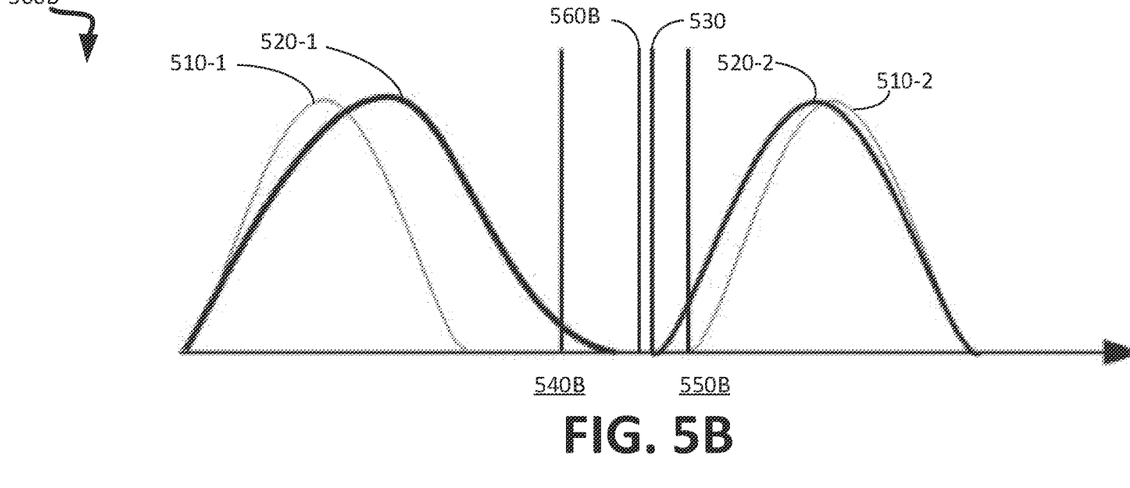

FIGS. 5A-5B are diagrams illustrating example implementations of multi-strobe reads that can be used to obtain an error metric during a two-sided page scan with calibration feedback, in accordance with some embodiments of the present disclosure. More specifically, FIG. 5A is a diagram 500A illustrating a two-strobe read that can be performed to obtain an error metric, and FIG. 5B illustrates a three-strobe read that can be performed to obtain the error metric, as described above with reference to FIG. 4.

Each the diagrams 500A and 500B includes a pair of initial $V_T$ distributions 510-1 and 510-2 that may be observed immediately after programming. Each of the diagrams 500A and 500B further includes a pair of current $V_T$ distributions 520-1 and 520-2 that may be observed some time after programming. For example, initial $V_T$ distribution 510-1 can be an initial erased state distribution and current $V_T$ distribution 520-1 can be a current erased state distribution. Further, initial $V_T$ distribution 510-2 can be an initial programmed state distribution and current $V_T$ distribution 520-2 can be a current programmed state distribution. As can be seen, the current $V_T$ distributions 520-1 and 520-2 are shifted with respect to $V_T$ distributions 510-1 and 510-2, respectively.

Each of the diagrams 500A and 500B further shows a calibrated read level 530. During typical read level calibration, the calibrated read level 530 can be obtained by moving the default read level (not shown) toward the right (in the direction of the $V_T$ distributions 510-2 and 520-2). The location of the calibrated read level 530 may reduce (e.g., eliminate) the ability to detect the shift of the current $V_T$ distribution 520-1 relative to the initial $V_T$ distribution 510-1. Thus, by the time that the shift of the current $V_T$ distribution 520-1 is detected, it may be too late to address the data degradation. Obtaining an error metric (e.g. BEC, BER and/or BERatio) using a multi-strobe read (e.g., the two-strobe read shown in FIG. 5A or the three-strobe read shown in FIG. 5B) can improve the ability to detect the shift of the current $V_T$ distribution 520-1 relative to the initial $V_T$ distribution 510-1.

FIG. 5A further shows a negative read level offset 540A and a positive read level offset 550A. The calibrated read level 530 is shown for reference purposes to illustrate the positioning of the offsets 540A and 550A. For example, the positioning of the offsets 540A and 540B can be calculated with respect to the position of the calibrated read level 530. The negative read level offset 540A may be located at approximately the same location as the default read level. During a two-strobe read (e.g., SBSBR), a strobe read can be performed using the negative read level offset 540A and a strobe read can be performed using the positive read level offset 550A. The outputs of the strobe reads can be used to obtain an error metric, as described above with reference to FIGS. 1-4. For example, the error metric can be at least one of a BEC, BER or BERation obtained within the region defined between the offsets 540A and 540B.

FIG. 5B further shows a left read level offset 540B, a right read level offset 550B and a center read level offset 560B. The calibrated read level 530 is shown for reference purposes to illustrate the positioning of the offsets 540B-560B. For example, the positioning of the offsets 540B-560B can be calculated with respect to the position of the calibrated read level 530. The left read level offset 540B may be located at approximately the same location as the default read level. During a three-strobe read (e.g., RSO), a strobe read can be performed using the left read level offset 540B, a strobe read can be performed using the right read level offset 550B, and a strobe read can be performed using the center read level offset 560B. The outputs of the strobe reads can be used to obtain an error metric used for implementing two-sided page scans with calibration feedback, as described above with reference to FIGS. 1-4. For example, the error metric can be at least one of a BEC, BER or BERatio derived from each of the three strobe reads performed using respective ones of the offsets 540B-560B.

Figure 6:
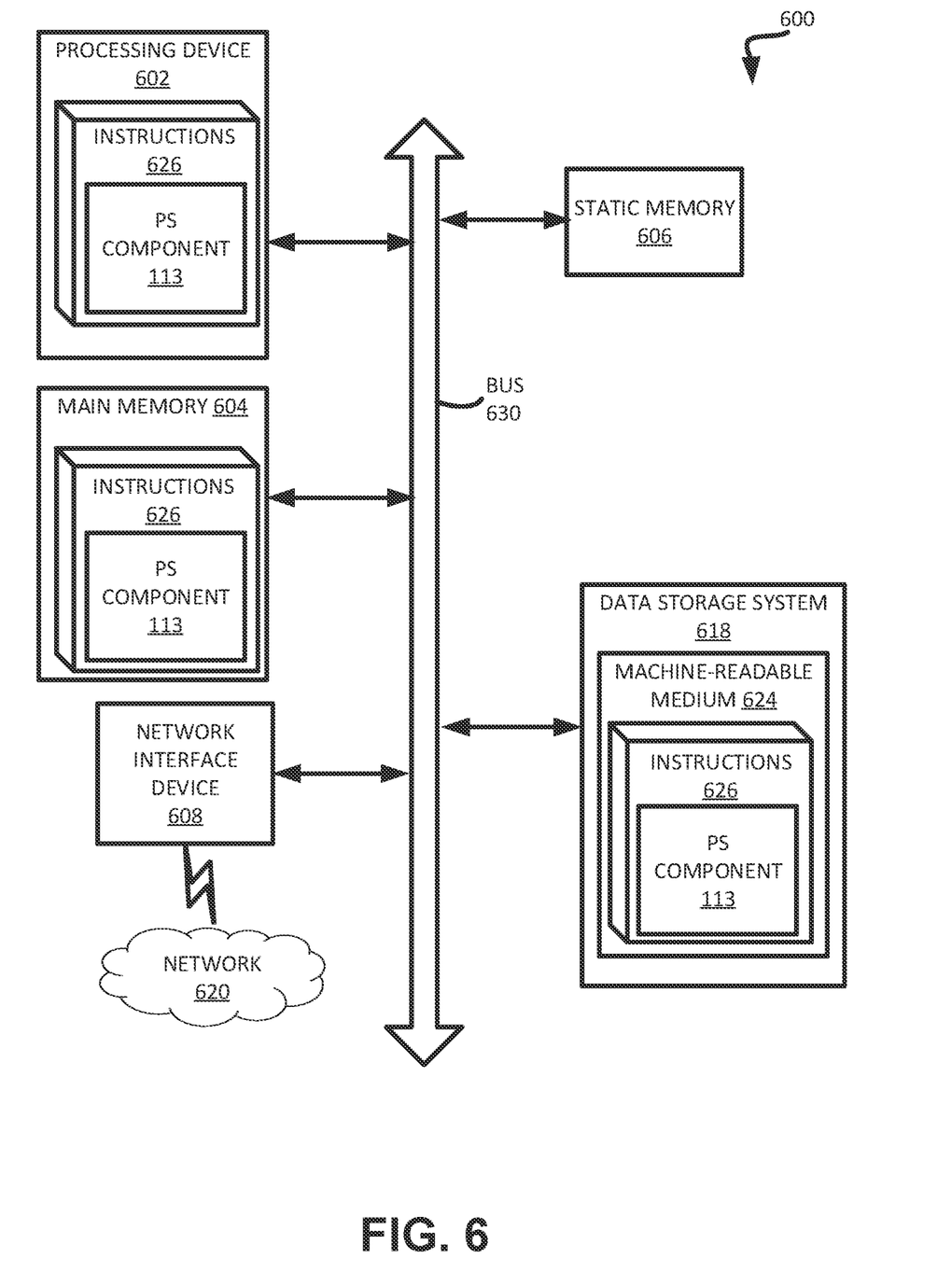
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the PS component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 426 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a PS component (e.g., the PS component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
    a memory device comprising a block; and
    a processing device, operatively coupled with the memory device, to perform operations comprising:
        initiating a page scan with respect to a page of the block;
        determining whether to perform an erased page check; and
        in response to determining that the erased page check is not to be performed, performing a two-sided page scan with calibration feedback.

2. The system of claim 1, wherein performing the two-sided page scan comprises:
    obtaining an error metric by reading the page using a first multi-strobe read;
    determining whether the error metric satisfies a first threshold condition; and
    in response to determining that the error metric does not satisfy the first threshold condition, causing the block to be maintained.

3. The system of claim 2, wherein the error metric comprises at least one of: a bit error count, a bit error rate, or a bit error ratio.

4. The system of claim 2, wherein the first multi-strobe read is a two-strobe read.

5. The system of claim 2, wherein the first multi-strobe read is a three-strobe read.

6. The system of claim 2, wherein the operations further comprise:
- in response to determining that the error metric satisfies the first threshold condition, obtaining a set of parameters by reading the page using a second multi-strobe read, wherein the set of parameters comprises a first parameter;
- determining whether the first parameter satisfies a second threshold condition; and
- in response to determining that the first parameter satisfies the second threshold condition, causing the block to be refreshed.

7. The system of claim 6, wherein the set of parameters further comprises a second parameter, and wherein the operations further comprise:
- determining whether the second parameter satisfies a third threshold condition;
- in response to determining that the second parameter satisfies the third threshold condition, triggering calibration of the block; and
- in response to determining that the second parameter does not satisfy the third threshold condition, causing the block to be maintained.

8. The system of claim 7, wherein:
- the second multi-strobe read is a three-strobe read;
- the first parameter is an estimated center differential; and
- the second parameter is an estimated left differential or an estimated right differential.

9. A method comprising:
- initiating, by a processing device, a page scan with respect to a page of a block of a memory device;
- determining, by the processing device, whether to perform an erased page check; and
- in response to determining that the erased page check is not to be performed, performing, by the processing device, a two-sided page scan with calibration feedback.

10. The method of claim 9, wherein performing the two-sided page scan comprises:
- obtaining an error metric by reading the page using a first multi-strobe read;
- determining whether the error metric satisfies a first threshold condition; and
- in response to determining that the error metric does not satisfy the first threshold condition, causing the block to be maintained.

11. The method of claim 10, wherein the error metric comprises at least one of: a bit error count, a bit error rate, or a bit error ratio.

12. The method of claim 10, wherein the first multi-strobe read is a two-strobe read.

13. The method of claim 10, wherein the first multi-strobe read is a three-strobe read.

14. The method of claim 10, further comprising:
- in response to determining that the error metric satisfies the first threshold condition, obtaining, by the processing device, a set of parameters by reading the page using a second multi-strobe read, wherein the set of parameters comprises a first parameter;
- determining, by the processing device, whether the first parameter satisfies a second threshold condition; and
- in response to determining that the first parameter satisfies the second threshold condition, causing, by the processing device, the block to be refreshed.

15. The method of claim 14, wherein the set of parameters further comprises a second parameter, and wherein the method further comprises:
- determining, by the processing device, whether the second parameter satisfies a third threshold condition;
- in response to determining that the second parameter satisfies the third threshold condition, triggering, by the processing device, calibration of the block; and
- in response to determining that the second parameter does not satisfy the third threshold condition, causing, by the processing device, the block to be maintained.

16. A non-transitory computer-readable storage medium comprising instructions that, when executed by a processing device, cause the processing device to perform operations comprising:
- obtaining an error metric by reading a page of a block using a first multi-strobe read, wherein the first multi-strobe read comprises at least one of a two-strobe read or a three-strobe read, and wherein the error metric comprises at least one of: a bit error count, a bit error rate, or a bit error ratio;
- determining whether the error metric satisfies a first threshold condition; and
- in response to determining that the error metric satisfies the first threshold condition, obtaining a set of parameters by reading the page using a second multi-strobe read, wherein the second multi-strobe read is a second three-strobe read, and wherein the set of parameters comprises an estimated left differential, an estimated right differential and an estimated center differential.

17. The non-transitory computer-readable storage medium of claim 16, wherein the operations further comprise, in response to determining that the error metric satisfies the first threshold condition, causing the block to be maintained.

18. The non-transitory computer-readable storage medium of claim 16, wherein the operations further comprise:
- determining whether the estimated center differential satisfies a second threshold condition; and
- in response to determining that the estimated center differential satisfies the second threshold condition, causing the block to be refreshed.

19. The non-transitory computer-readable storage medium of claim 18, wherein the operations further comprise:
- determining whether the estimated left differential or the estimated right differential satisfies a third threshold condition; and
- in response to determining that the estimated left differential or the estimated right differential satisfies the third threshold condition, triggering calibration of the block.

20. The non-transitory computer-readable storage medium of claim 19, wherein the operations further comprise, in response to determining that the estimated left differential or the estimated right differential does not satisfy the third threshold condition, causing the block to be maintained.

* * * * *